(12) United States Patent
Cooper et al.

(10) Patent No.: US 7,196,274 B2
(45) Date of Patent: *Mar. 27, 2007

(54) MULTI-LAYER INTEGRATED RF/IF CIRCUIT BOARD

(75) Inventors: Michael Cooper, Aylmer (CA); Robert A. Leroux, Ottawa (CA)

(73) Assignee: DragonWave Inc., Ottawa (CA)

(*) Notice: Subject to any disclaimer, the term of this patent is extended or adjusted under 35 U.S.C. 154(b) by 278 days.

This patent is subject to a terminal disclaimer.

(21) Appl. No.: 10/894,563

(22) Filed: Jul. 20, 2004

(65) Prior Publication Data

US 2006/0017529 A1 Jan. 26, 2006

(51) Int. Cl.
- H01R 12/04 (2006.01)
- H05K 1/03 (2006.01)
- H05K 1/11 (2006.01)

(52) U.S. Cl. ............... 174/255; 174/262; 361/792
(58) Field of Classification Search ............... 174/255, 174/261–266; 361/792–795, 803, 804
See application file for complete search history.

(56) References Cited

U.S. PATENT DOCUMENTS

| | | | | |
|---|---|---|---|---|
| 5,451,721 A | * | 9/1995 | Tsukada et al. | ............. 174/261 |
| 5,982,250 A | * | 11/1999 | Hung et al. | ................... 333/26 |
| 6,084,779 A | * | 7/2000 | Fang | ........................... 361/763 |
| 6,091,355 A | * | 7/2000 | Cadotte et al. | ............. 342/104 |
| 6,930,258 B1 | * | 8/2005 | Kawasaki et al. | .......... 174/264 |
| 2004/0150966 A1 | * | 8/2004 | Hu | ............................ 361/763 |
| 2004/0150969 A1 | * | 8/2004 | Chan et al. | ................ 361/792 |
| 2006/0104042 A1 | * | 5/2006 | Hsu | ........................... 361/793 |

* cited by examiner

Primary Examiner—Dean A. Rechard
Assistant Examiner—Jeremy C. Norris
(74) Attorney, Agent, or Firm—Sawyer Law Group LLP

(57) ABSTRACT

A multi-layered integrated RF/IF circuit board is provided. The board is fabricated beginning with a center layer of material. In a first preferred embodiment, the center layer is a rigid core material. In a second preferred embodiment, the center layer is a pliable non-conductive material. For every layer added to the upper surface of the stack-up structure of the board, a corresponding layer of the same material is added to the lower surface of the stack-up structure. Thus, during the lamination process, both the upper and lower surfaces are primarily soft, pliable non-conductive material. These non-conductive layers absorb any stresses introduced during the lamination process. Thus, when cooled, the board has large area flatness. Standard manufacturing processes can be used for each individual step in the fabrication of the board. Therefore, a multi-layered integrated RF/IF circuit board in accordance with the present invention can be fabricated inexpensively.

11 Claims, 19 Drawing Sheets

MULTI-LAYER INTEGRATED RF/IF CIRCUIT BOARD

CROSS-REFERENCE TO RELATED APPLICATIONS

This application is related to co-pending U.S. patent application Ser. No. 10/894,885, entitled "Improved Multi-Layer Integrated RF/IF Circuit Board", filed on Jul. 20, 2004.

FIELD OF THE INVENTION

The present invention relates to radio circuit boards, and more particularly to radio circuit boards that transmit and receive high frequency signals over a wireless link.

BACKGROUND OF THE INVENTION

The demand for high speed data connections is growing every day. The cost and delay associated with installing electrical and optical cables to carry high speed data are often greater than the market can bear. As an alternative, wireless broadband access (WBA) services have been developed which allow for transmission of high speed data over the wireless channel. WBA service is typically offered in a relatively high frequency band (such as 18 to 40 GHz) so that the operational bandwidth can be very broad such as about (50 MHz) allowing data rates of 200 megabits per second (MBPS) and higher. Many countries have specifically allocated spectrum for the WBA services. However, the allocated spectrum is not consistent and varies from country to country.

One key element of any WBA system is the radio card which transmits and receives the high frequency signals over the wireless link. Designing a new radio card for each possible frequency band is expensive and time consuming.

As the WBA service market grows, more pre-packaged parts are available to radio designers. For example, Hittite Microwave Corporation™ makes a line of packaged GaAs parts for use in the 20 to 40 GHz range. One part made by Hittite™ is the HMC264LM3 GaAs MMIC Sub-Harmonic SMT Mixer 20–30 GHZ™. The part comes in a leadless chip carrier package. The specification sheet for the part recommends mounting the device on Rogers RO4003™ material using 0.5 oz. copper.

Rogers RO4003™ material is made by Rogers Corporation™. The material is a glass reinforced hydrocarbon thermoset laminate. FIG. 1 illustrates a Rogers™ multi-layered printed circuit board (PCB). The stack up 100 of the Rogers™ PCB includes a core material I with a plurality of conductive and non-conductive layers at its upper and lower surfaces. At the upper surface of the core 1, the stack up 100 includes a first inner conductive layer 2A, a first inner non-conductive layer 3A, and a first Rogers™ core 5A with a first outer conductive layer 4A and a first outer-most conductive layer 6A. At the lower surface of the core 1, the stack up 100 includes a second inner conductive layer 2B, a second inner non-conductive layer 3B, and a second Rogers™ core 5B with a second outer conductive layer 4B and a second outer-most conductive layer 6B. As shown in FIG. 1, the stack up 100 further includes vias 7A, 7B, 8A, 8B, and an opening 9.

Several difficulties arise with the Rogers™ multi-layer PCB. A typical radio includes both a very high radio frequency (RF) portion and a lower intermediate frequency (IF) portion. However, a composite PCB made from a RO4000 series or other ceramic or Teflon laminate does not provide a good substrate for the lower frequency operation. Lower frequency designs work better with thicker dielectric materials, i.e., larger metal features provides better tolerance at IF, while the high frequency materials are typically very thin. An assembly incorporating a daughter board to carry the RF or IF signaling can be used to boost signal performance, but this solution is more expensive and difficult to manufacture than a single board design.

In addition, the Rogers™ multi-layered PCB requires a custom manufacturing process. FIG. 2 is a flowchart illustrating the manufacturing process for the Rogers™ multi-layer PCB. First, the core 1 is provided with the first inner conductive layer 2A at a first surface and the second inner conductive layer 2B at a second surface opposite to the first surface, via step 201. Next, the first inner non-conductive layer 3A is applied to the first inner conductive layer 2A, via step 202, and a second inner non-conductive layer 3B is applied to the second inner conductive layer 2B, via step 203. Then, a first Rogers™ core 5A, with a first outer conductive layer 4A on one side and a first outer-most conductive layer 6A on the other side, is applied to the first inner non-conductive layer 3A, via step 204. A second Rogers™ core 5B, with a second outer conductive layer 4B on one side and a second outer-most conductive layer 6B on the other side, is applied to the second inner non-conductive layer 3B, via step 205. All of the above layers are then simultaneously laminated, via step 206. However, this manufacturing process is expensive since specialized, custom processing steps are required.

Conventional radio cards that integrate RF and IF have several other disadvantages. For example, the high frequency materials used in the radio cards are expensive. A PCB which uses these materials is much more expensive to design, prototype, iterate and produce. Even if these high frequency materials are used with standard PCB materials, compatibility and responsibility issues limit their viability. The high frequency materials are typically manufactured by a company different from the one that manufactures the standard PCB materials. If the high frequency material delaminates from the lower frequency materials produced by the other company, no single company is responsible for the failure. This increases both the financial and technical risks associated with the use of a composite PCB.

Also, ceramic laminates are rigid. During the PCB fabrication process, the rigid high frequency material is laminated to a standard rigid FR4 core material using both heat and pressure. A special glue or prepreg material is placed between the high frequency material and the FR4 core. The assembly is pressed between two heated plates. The glue melts and deforms to provide a mechanical connection to the assembly. Because both the high frequency material and the stand FR4 core are rigid, stress builds up between the plates and both surfaces of the PCB at various locations during the lamination process. As the PCB is cooled and removed from the press, the PCB seeks to relieve these stresses by deforming. Because the location of the stresses varies based on the design features impressed on the PCB, the PCB may become concave, convex, wavey or twisted. Predicting the effects of the stress is extremely difficult. Relieving the stress can require redesign of the RF and IF layout of the PCB, or require adjustment in the machinery. Thus, use of rigid ceramic laminates may result in a PCB which is not flat and which causes a variety of negative effects to the fully assembled board.

Another problem with conventional radio cards concerns the mounting of a microstrip filter to the PCB. At high frequency bands, it is convenient to use a microstrip to create certain circuit elements such as transmission lines, couplers and filters. As the frequency band at which the system operates varies, the filtering requirements imposed on the radio card also vary. Thus, in a reusable, versatile PCB design, the microstrip filters cannot be printed directly on the PCB, and the tolerance on a low cost PCB is not good. Instead, the filters can be designed on a surface mount substrate or leadless surface mount substrate. One common substrate is alumina. A surface mount printed filter is soldered to the PCB to provide both signaling and a ground plane to the filter. However, when the conventional PCB is not flat, the surface mount printed filter may not properly attach or it may detach from the PCB when the populated PCB is installed in its housing.

Accordingly, there exists a need for an improved multi-layered integrated RF/IF circuit board. The improved board should provide good RF and IF performance on a single board. Its manufacturing process should be inexpensive, requiring little or no custom processing. The present invention addresses such a need.

SUMMARY OF THE INVENTION

An improved multi-layered integrated RF/IF circuit board has been disclosed. The board is fabricated beginning with a center layer of material. In a first preferred embodiment, the center layer is a rigid core material. In a second preferred embodiment, the center layer is a pliable non-conductive material. For every layer added to the upper surface of the stack-up structure of the board, a corresponding layer of the same material is added to the lower surface of the stack-up structure. Thus, during the lamination process, both the upper and lower surfaces are primarily soft, pliable non-conductive material. These non-conductive layers absorb any stresses introduced during the lamination process. Thus, when cooled, the board has large area flatness. Standard manufacturing processes can be used for each individual step in the fabrication of the board. Therefore, a multi-layered integrated RF/IF circuit board in accordance with the present invention can be fabricated inexpensively.

DETAILED DESCRIPTION

The present invention provides an improved multi-layered integrated RF/IF circuit board. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

According to the present invention, a versatile radio card design which can be used in a variety of different bands is provided. The radio card is a single versatile printed circuit board (PCB) which can be populated with different components in order to provide operation in one of two or more frequency bands. The PCB in accordance with the present invention is made from standard board materials of the same family of materials. Thus, standard manufacturing processes for the individual steps may be used. The PCB in accordance with the present invention provides good functionality at high frequency (RF) as well as at intermediate frequencies (IF) and with digital signals.

To more particularly describe the features of the present invention, please refer to FIGS. 3 through 15 in conjunction with the discussion below.

Figure 1:
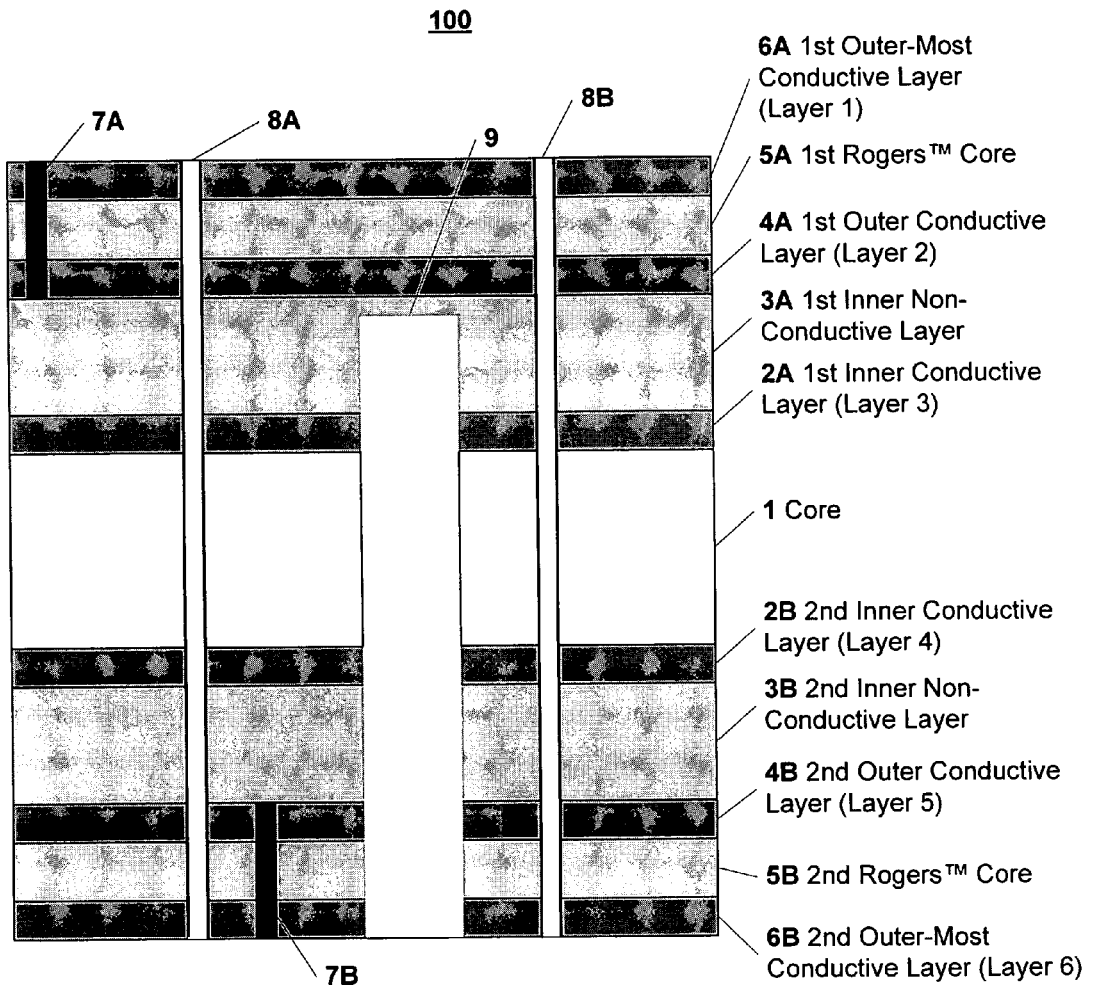
FIG. 1 illustrates a Rogers™ multi-layered printed circuit board (PCB).
Figure 2:
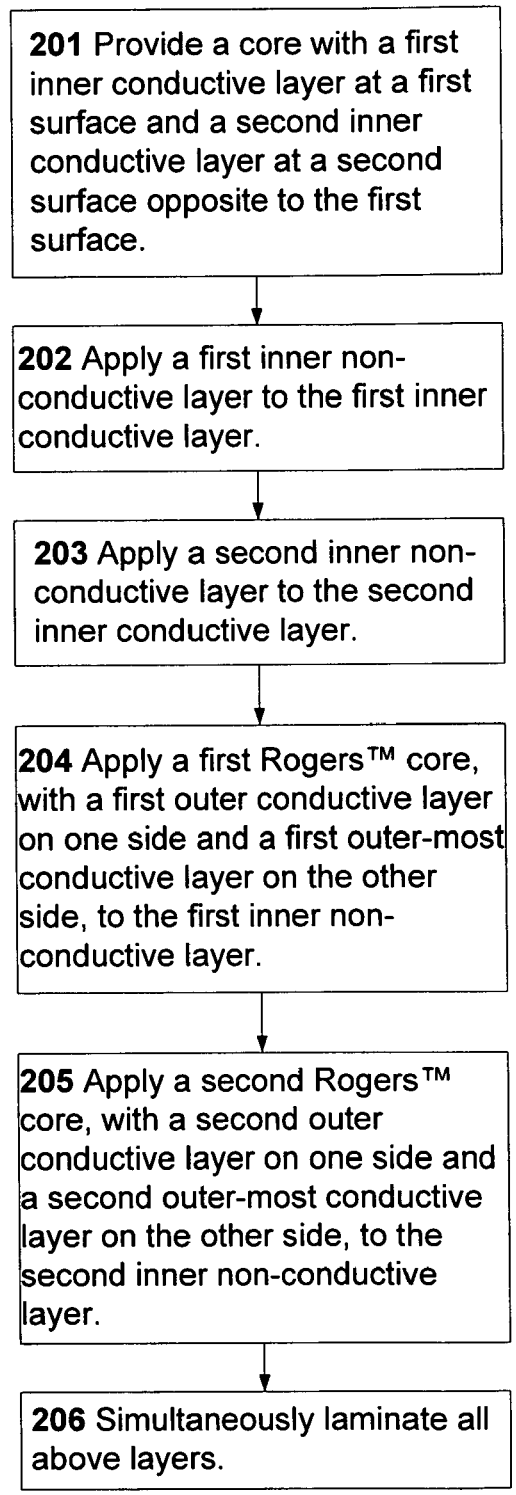
FIG. 2 is a flowchart illustrating the manufacturing process for the Rogers™ multi-layer PCB.
Figure 3:
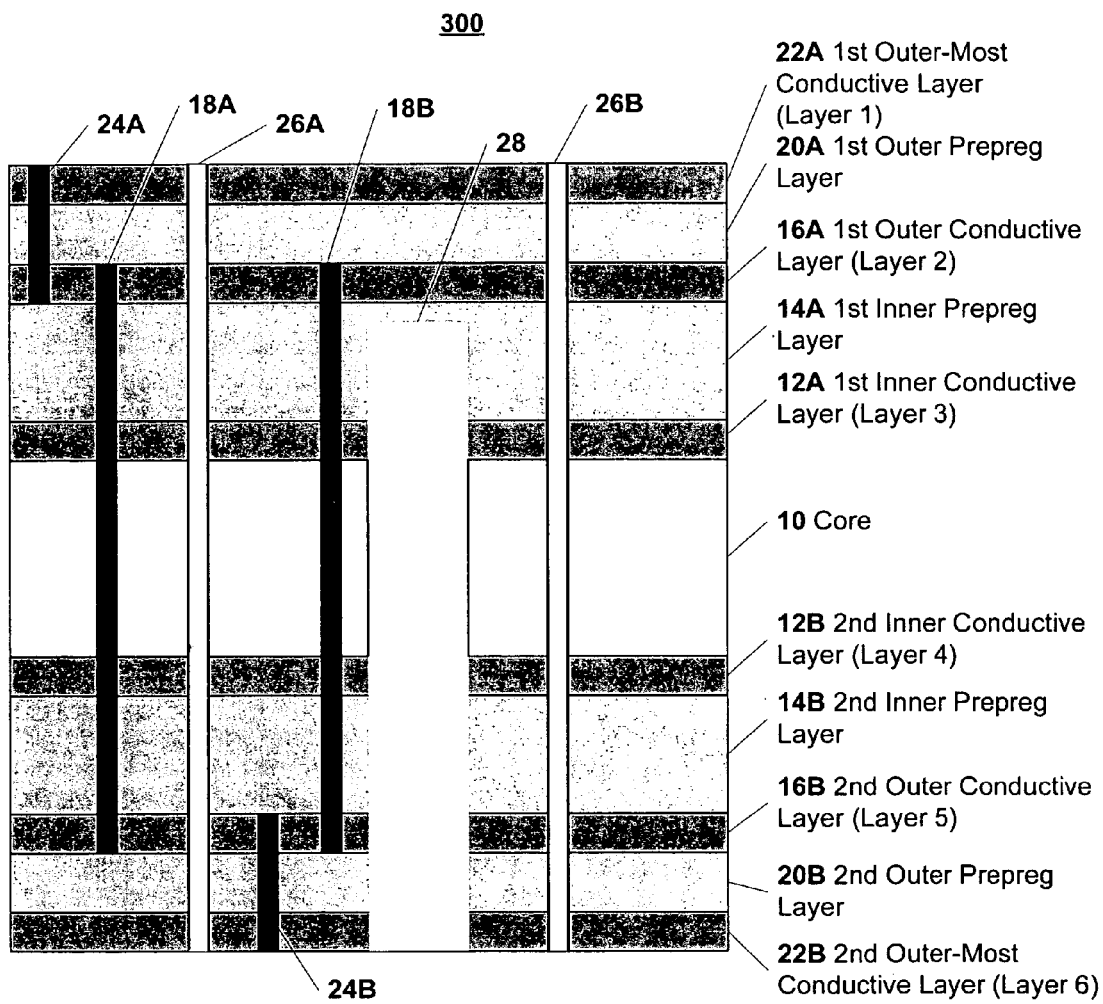
FIG. 3 illustrates a vertical cross-sectional view of a first preferred embodiment of a stack up structure for a multi-layered integrated RF/IF circuit board in accordance with the present invention.

FIG. 3 illustrates a vertical cross-sectional view of a first preferred embodiment of a stack up structure for a multi-layered integrated RF/IF circuit board in accordance with the present invention. The stack up 300 comprises a core material 10 with a plurality of conductive and non-conductive layers at its upper and lower surfaces. In this embodiment, the non-conductive layers are prepreg layers but can be other types of glue material. The final stack up 300 comprises a first, outer-most conductive layer 22A, forming Layer 1 of the stack up 300. Components for signal output are mounted on top of the conductive layer 22A. Under the first conductive layer 22A and coupled to the upper surface of the core 10, the final stack up 300 also comprises a first, outer prepreg layer 20A, a first outer conductive layer 16A (Layer 2), a first inner prepreg layer 14A, and a first inner conductive layer 12A (Layer 3). The first outer conductive layer 16A provide the RF ground, while the first inner conductive layer 12A provide the IF ground.

Coupled to the lower surface of the core 10, the final stack up 300 also comprises a second inner conductive layer 12B (Layer 4), a second inner prepreg layer 14B, a second outer conductive layer 16B (Layer 5), a second outer prepreg layer 20B, and a second outer-most conductive layer 22B (Layer 6). The second outer-most conductive layer 22B is the ground or routing layer for the stack up 300. A waveguide backshort and heat sink (not shown) can be mounted beneath the second outer-most conductive layer 22B. Traces are etched onto the conductive layers 16A, 12A, 12B, and 16B.

The stack up 300 further comprises a plurality of vias, including buried vias 18A–18B, micro-vias 24A–24B, and through vias 26A–26B. In order to connect one conductive layer to another, a conductive path through the stack must be constructed. These vertical paths are called vias. A via which traverses the entire stack allowing the interconnection of any layer of the board to any other layer or to multiple layers is called a through via. A via which traverses one or more internal layers but does not traverse either outer layer is called a buried via. A micro-via is a small via (typically with a diameter of 0.002 inches–0.015-inches) that connects an outer layer of a PCB to the nearest inner layer or even deeper if thin substrates are used.

The stack up 300 further comprises a routed opening 28 for the waveguide which traverses from the bottom of the stack up 300 to approximately half-way into the prepreg layer 14A.

Note that the stack up 300 includes only one piece of rigid material, i.e., the core 10. Additional layers of conductive material are added using prepreg material. The stack up 300 is thus symmetrical about a center core 10.

Figure 4:
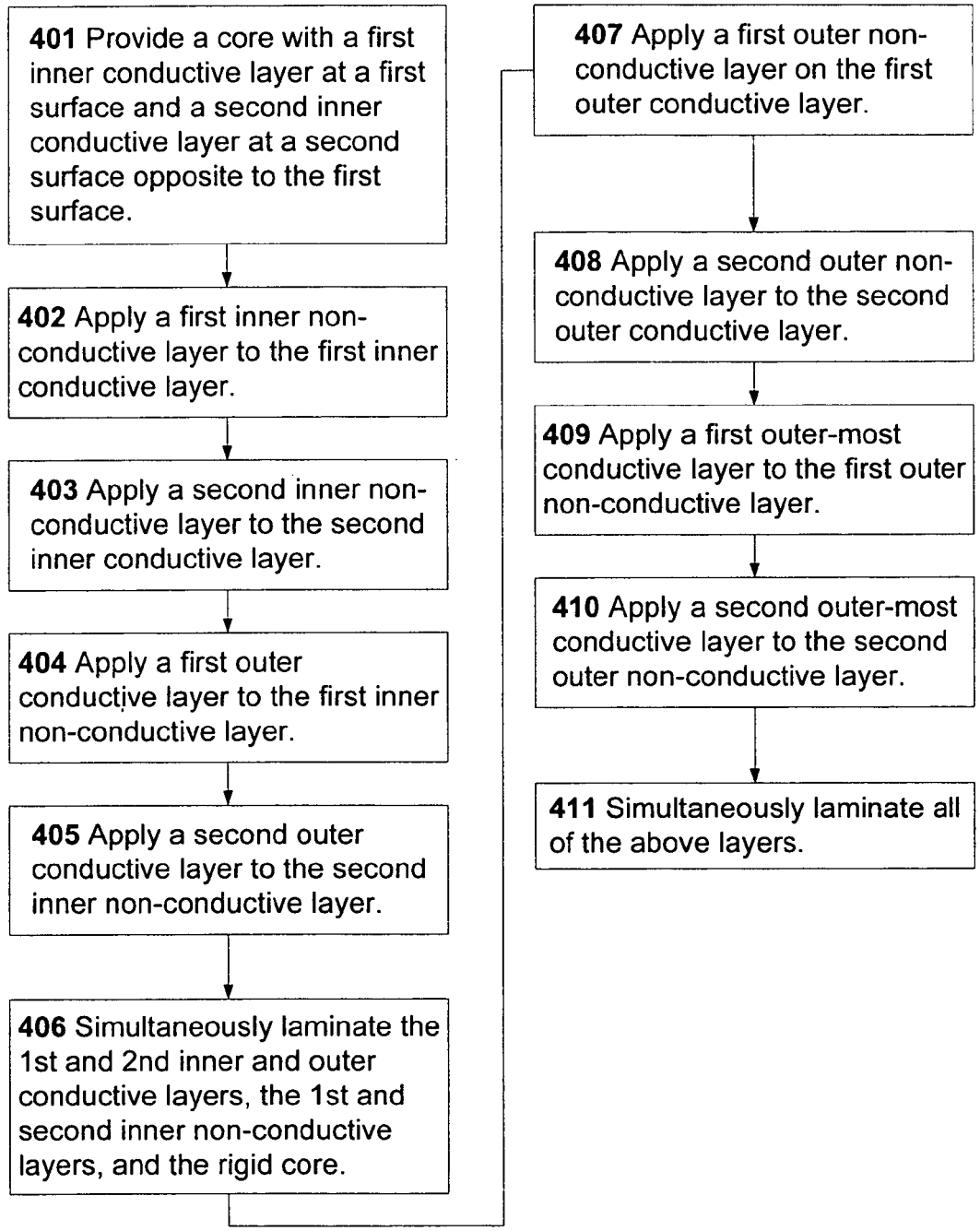
FIG. 4 is a flowchart illustrating a first preferred embodiment of a method for fabricating a multi-layered integrated RF/IF circuit board in accordance with the present invention.

FIG. 4 is a flowchart illustrating a first preferred embodiment of a method for fabricating a multi-layered integrated RF/IF circuit board in accordance with the present invention. First, a core 10 is provided with a first inner conductive layer 12A at a first surface of the core 10 and a second inner conductive layer 12B at a second surface of the core 10 opposite to the first surface, via step 401. Next, a first inner non-conductive layer 14A is applied to the first inner conductive layer 12A, via step 402, and a second inner non-conductive layer 14B is applied to the second inner conductive layer 12B, via step 403. Next, a first outer conductive layer 16A is applied to the first inner non-conductive layer 14A, via step 404, and a second outer conductive layer 16B is applied to the second inner non-conductive layer 14B, via step 405. The conductive layers 12A–12B and 16A–16B, the non-conductive layers 14A–14B, and the rigid core 10 are then simultaneously laminated, via step 406. The lamination process is performed under high pressure at a high temperature. While under pressure, the stack is heated uniformly and cooled. The heat and pressure melt the resin in the prepreg materials which saturates the fiberglass, providing mechanical coupling of the stack into a single board.

Note that for every layer added to the top of the stack up 300, a corresponding layer of the same material is added to the bottom of the stack up 300. In addition, during the lamination process, both the upper and lower surfaces are primarily soft, pliable prepreg, the non-conductive material for this embodiment. The prepreg layers 14A–14B absorb any stresses introduced during the lamination process by the flow of the melted resin. Thus, once cooled, the stack assembly has large area flatness.

After the first lamination process, via step 406, a first outer non-conductive layer 20A is applied to the first outer conductive layer 16A, via step 407, and a second outer non-conductive layer 20B is applied to the second outer conductive layer 16B, via step 408. A first outer-most conductive layer 22A is then applied to the first outer non-conductive layer 20A, via step 409, and a second outer-most conductive layer 22B is applied to the second outer non-conductive layer 20B, via step 410. All of the above layers are then simultaneously laminated in a second lamination process, via step 411. As with the first lamination process, the second lamination process is performed under high pressure at a high temperature, where the stack is heated uniformly and cooled. The heat and pressure melt the resin in the prepreg materials which saturates the fiberglass, providing mechanical coupling of the stack into a single board. The first and second outer non-conductive layers 20A–20B absorb any stresses introduced during the lamination process by the flow of the melted resin. Thus, once cooled, a board with large area flatness can be realized.

Figure 5:
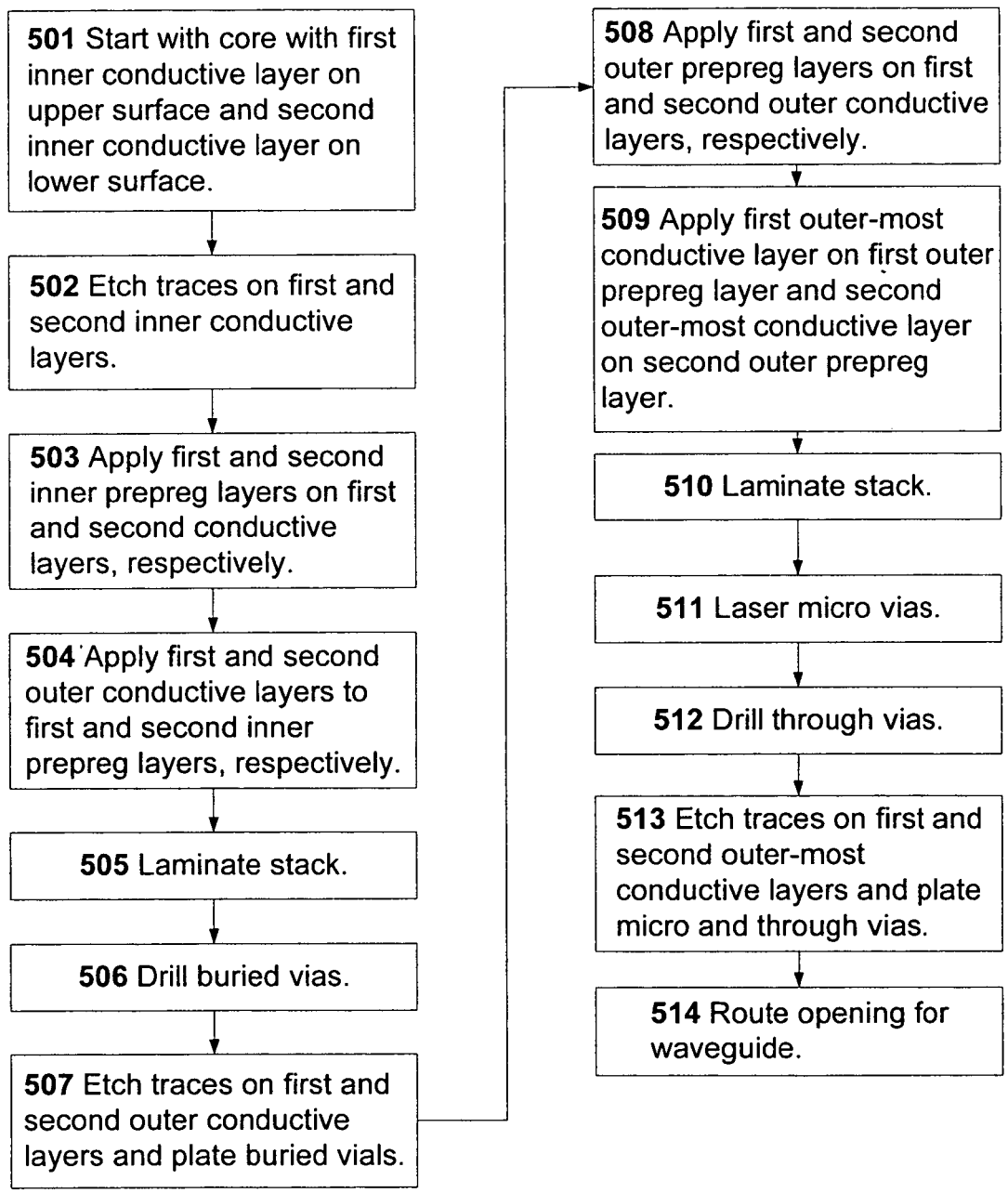
FIG. 5 is a flowchart illustrating in more detail the first preferred embodiment of the method for fabricating a multi-layered integrated RF/IF circuit board in accordance with the present invention.

FIG. 5 is a flowchart illustrating in more detail the first preferred embodiment of the method for fabricating a multi-layered integrated RF/IF circuit board in accordance with the present invention. FIGS. 6A–6I illustrate the steps of this method. Referring to FIG. 5 and FIGS. 6A–6I, first, a comparatively homogenous material is selected for the core 10, via step 501 and illustrated in FIG. 6A. For example, the core 10 may be 21 mil, GETEK™ core material made from three layers of 7628 material and sold by GE Electromaterials™ in a prefabricated form. In the prefabricated form, the core 10 is pre-metalized with the first and second inner conductive layers 12A and 12B. Traces are then etched on the first inner conductive layer 12A and the second inner conductive layers 12B, via step 502.

Figure 6A:
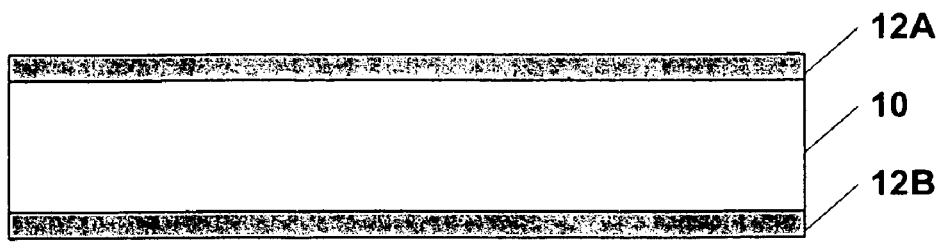
FIGS. 6A–6I illustrate the steps of the first preferred embodiment of the method for fabricating a multi-layered integrated RF/IF circuit board in accordance with the present invention.
Figure 6B:
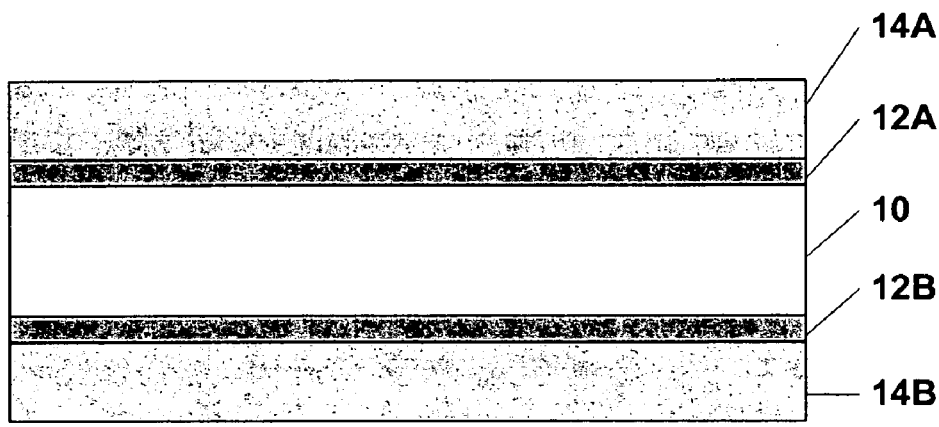
Figure 6C:

The first and second inner prepreg layers 14A and 14B are applied, respectively, to the etched first and second inner conductive layers 12A and 12B, via step 503 and illustrated in FIG. 6B. For example, the first and second inner prepreg layers 14A and 14B may be made of the 14 mil, GETEK™ prepreg material such as two layers of 7628 GETEK™ material. Next, the first and second outer conductive layers 16A and 16B are applied, respectively, to the first and second inner prepreg layers 14A and 14B, via step 504 and illustrated in FIG. 6C. For example, the conductive layers 16A and 16B may be thin copper foil selected from a variety of commercially available products. Then, the stack up assembly is laminated, via step 505.

As noted above, in steps 503 and 504, the same materials which are applied to the upper surface of the core 10 are also applied on the lower surface of the core 10. Thus, in step 505, when the partially completed stack is submitted to the first lamination process, the stack up assembly is symmetrical. In addition, because both the upper and lower surfaces are soft, pliable prepreg, any stresses introduced during the lamination process can be absorbed during the lamination process by the flow of the melted resin. Thus, when the cooled board is removed from the press, the board remains flat. At the completion of step 505, the core layer 10, the etched conductive layers 12A and 12B, the prepreg layers 14A and 14B, and the conductive layers 16A and 16B are assembled into a mechanically stable expanded core.

Figure 6D:
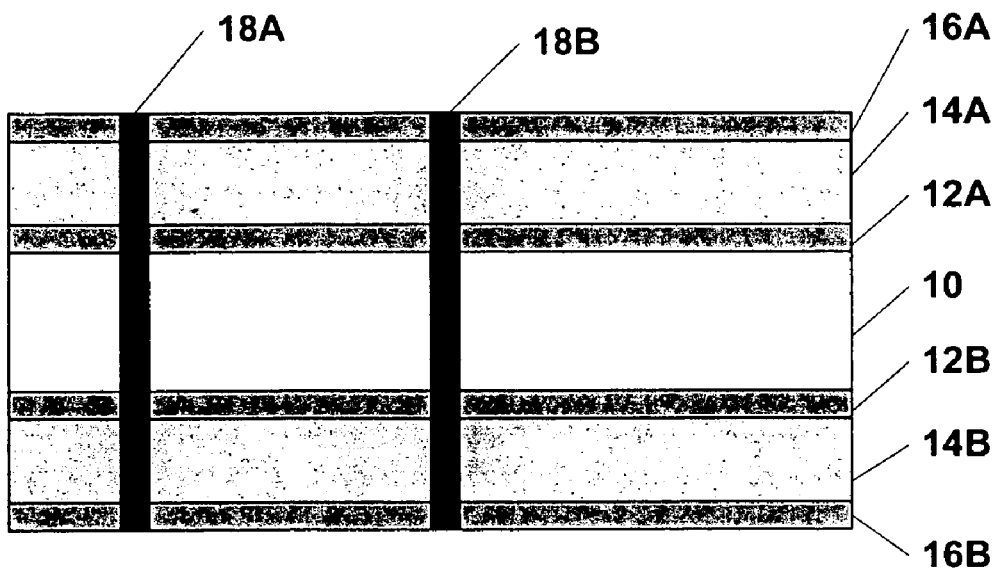

After lamination, buried vias 18A and 18B are drilled through the assembly, typically using a mechanical drill, via step 506 and illustrated in FIG. 6D. The traces in the conductive layers 16A and 16B are then etched, via step 507.

Also in step 507, the buried via 18A and 18B are plated to provide a vertical electrical connection through the PCB.

Figure 6E:
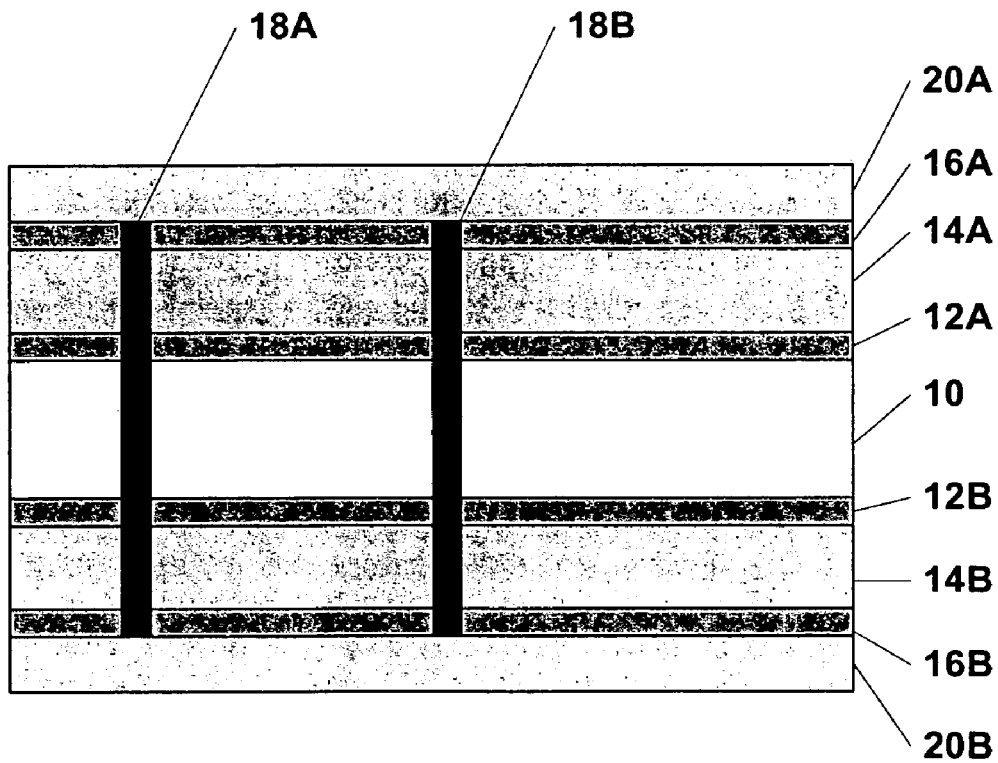
Figure 6F:
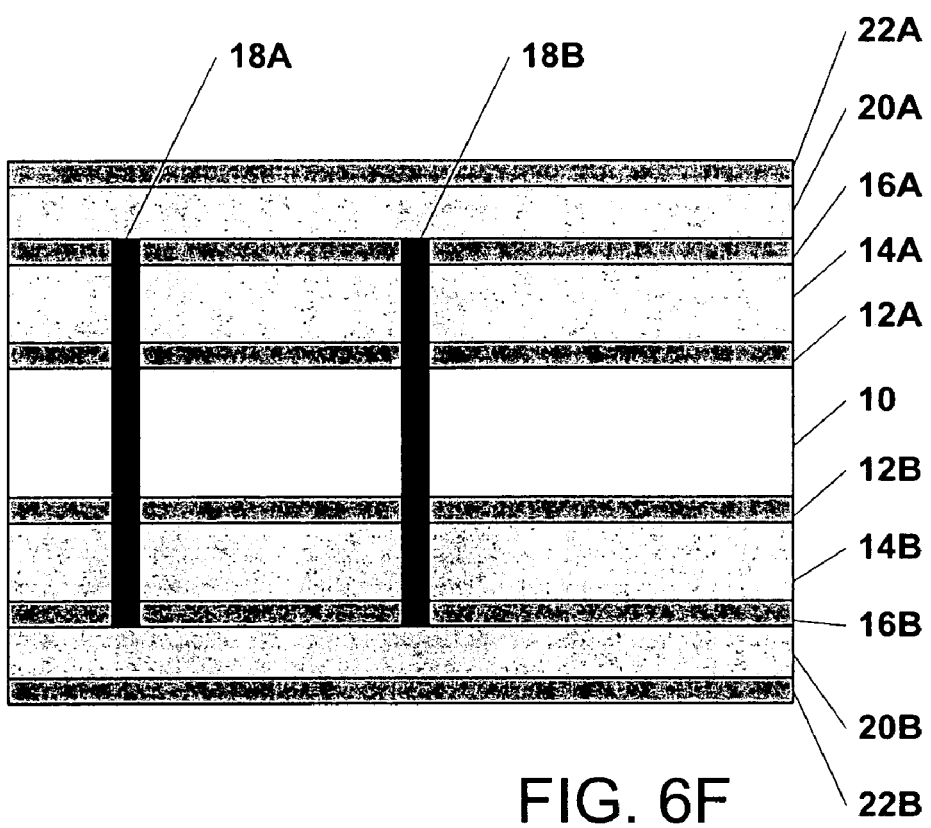

In step 508 and illustrated in FIG. 6E, the first and second outer prepreg layers 20A and 20B are applied to the upper and lower surface of the stack up assembly respectively. For example, the prepreg layers 20A and 20B may be made of the 7 mil, 7628 GETEK™ prepreg material. In step 509 and illustrated in FIG. 6F, the first and second outer-most conductive layers 22A and 22B are applied to the assembly.

The stack up assembly is then laminated again, via step 510. As noted above, in steps 508 and 509, the same materials which are applied to the upper surface of the expanded core are also applied on the lower surface of the expanded core. Thus, in step 510, when the stack up assembly is submitted to the second lamination process, the stack up assembly is symmetrical. In addition, because both the upper and lower surfaces are primarily soft prepreg, any stresses introduced during the lamination process can be absorbed by the flow of the melted resin. The prepreg material is also relatively inexpensive, which helps to lower the cost of manufacturing as the material is applied to both sides of the core. At the completion of step 510, when the cooled board is removed from the press, the board remains flat.

Figure 6G:
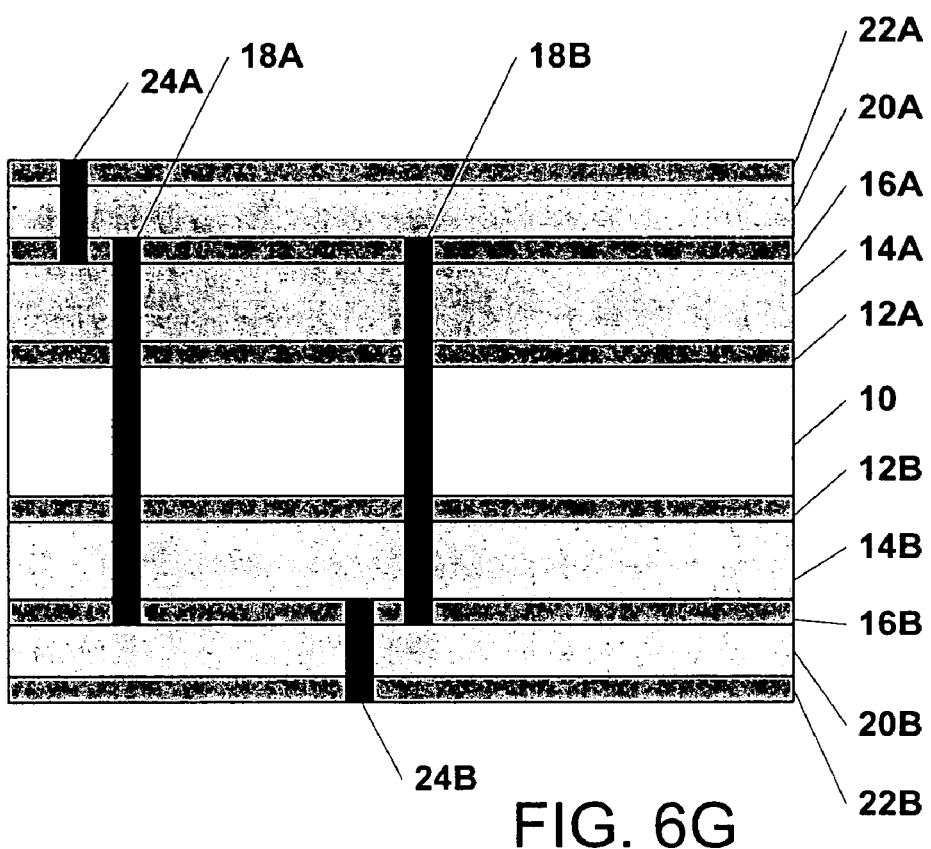
Figure 6H:
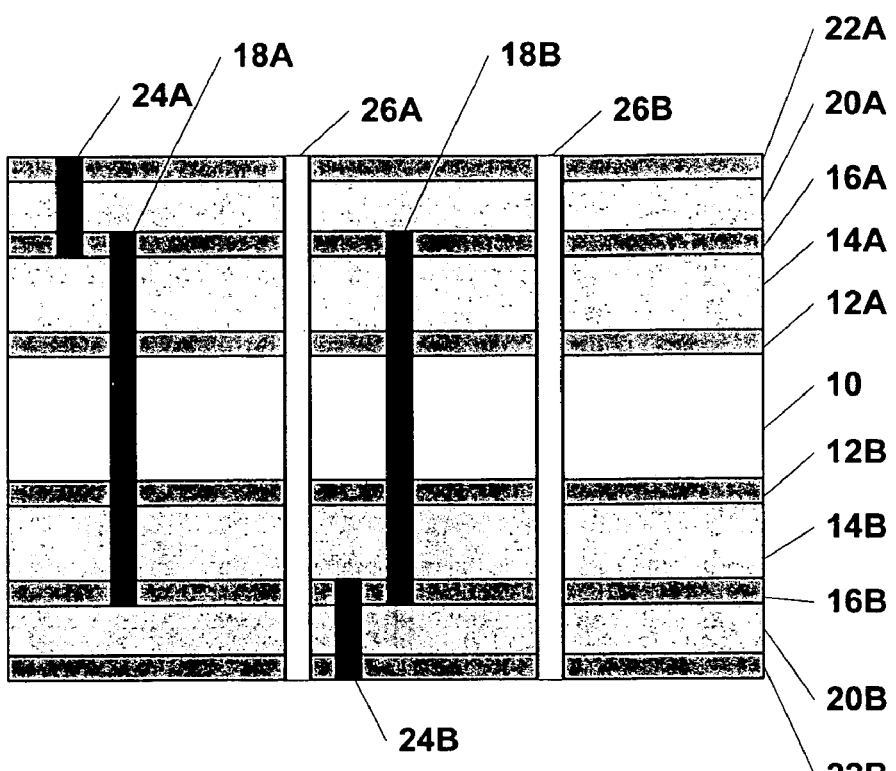
Figure 6I:
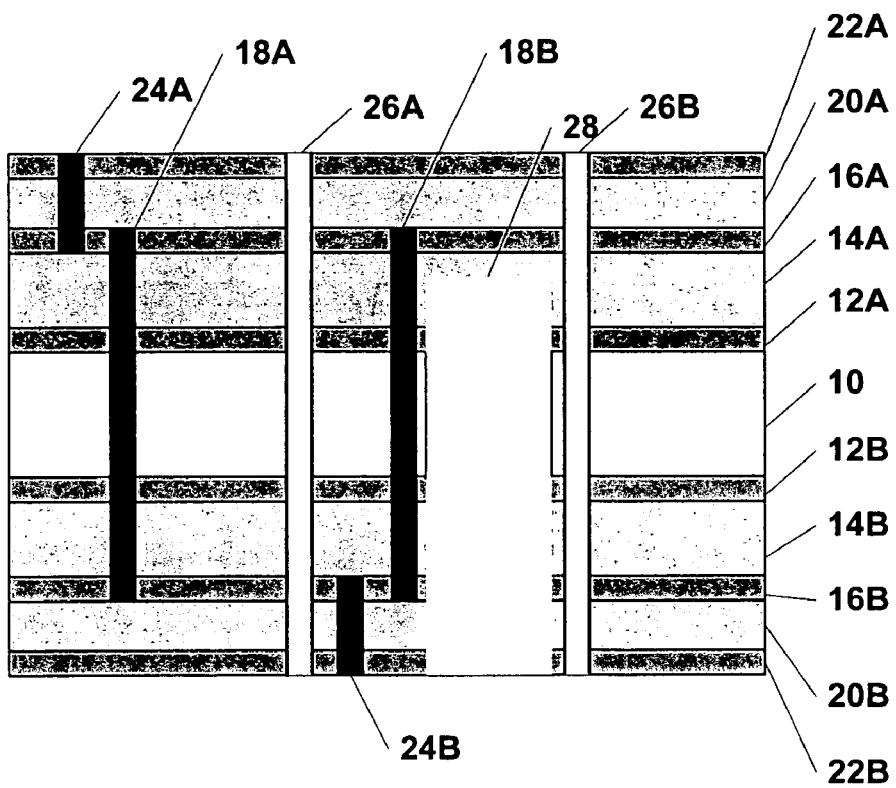

Next, micro-vias 24A and 24B are drilled (typically by laser) on the upper and lower outer-most layers, via step 511 and illustrated in FIG. 6G. The through vias 26A and 26B are drilled through the stack up assembly, via step 512 and illustrated in FIG. 6H. In step 513, the micro and through vias are plated, and the conductive layers 22A and 22B are etched. Because the RF performance of the micro-vias on the bottom layer of the board, such as micro-via 24B, is unimportant if no signals are carried thereby, these micro-vias could be mechanically drilled rather than laser drilled. A routed opening 28 is drilled into the stack up assembly to support a waveguide transition, via step 514 and illustrated in FIG. 6I.

Although the first preferred embodiment is described with the sequence of steps above, one of ordinary skill in the art will understand that these steps can be reordered without departing from the spirit and scope of the present invention. In addition, more two sets of prepreg layers can be added consistent with the invention, as well as just one set of prepreg layers.

One advantage of the stack up 300 is that its manufacturing process is relatively inexpensive. In contrast to conventional stack ups which incorporate special frequency substrates, the stack up 300 in accordance with the present invention can be constructed using industry standard processes in the individual steps. Not only are the materials from which it is built standard and, thus, less expensive, but the process is also less expensive and simpler. The board can be bid out to a large variety of overseas or domestic board houses, thus further allowing for cost reductions. In addition, the use of materials from with the same family of materials assist in assuring compatibility of materials and flatness of the board.

In the first preferred embodiment of the stack up 300, the outer non-conductive layer 20A is 7 mil prepreg. The thin nature of this material makes it particularly advantageous for high frequency (RF) strip line design (such as, for example, at 18 to 40 GHz). The bulk of the components are installed upon the upper most surface of the conductive layer 22A. To provide good performance at IF, the first outer conductive layer 16A under the IF section of the board can be etched away. Thus, the first outer prepreg layer 20A and adjacent prepreg layer 14A directly contact one another under the IF section. Since the prepreg layers 20A and 14A are of the same material, they form a single substrate. Thus, under the IF circuitry, a thicker dielectric layer is produced. For example, according to the exemplary dimensions given above, the combined substrate is 21 mils thick. This thicker dielectric layer under the IF section of the board provides good performance at IF.

Figure 7:
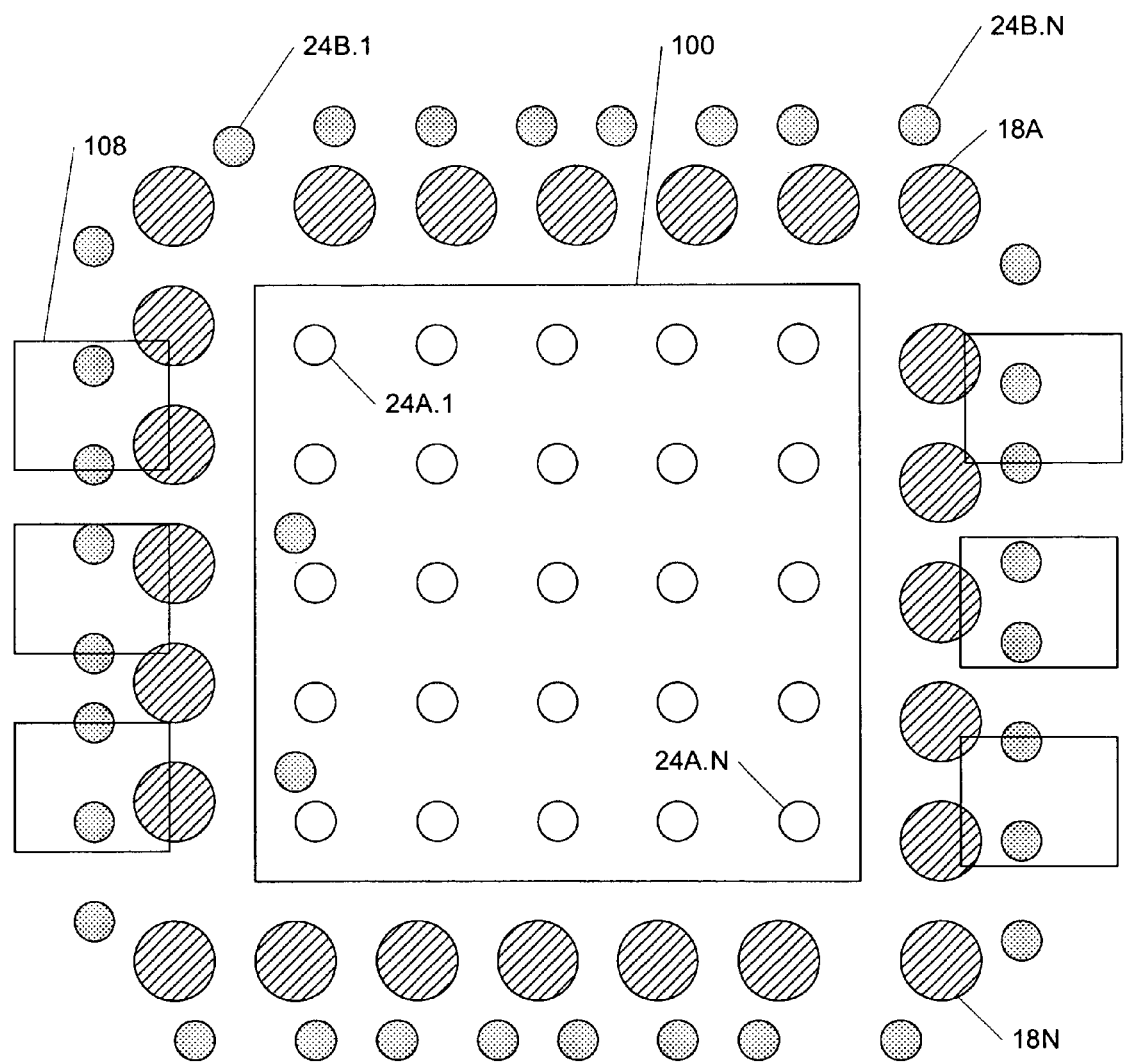
FIG. 7 illustrates a top view of a stack up providing a heat sink for an RF component in accordance with the present invention.

The first preferred embodiment of the stack up 300 can also be used to provide an effective heat sink for a component installed thereon. FIG. 7 illustrates a top view of a stack up providing a heat sink for an RF component in accordance with the present invention. The part outline 100 shows the outline of an RF part. For illustrative purposes, we assume that the RF part is a commercial, prepackaged part. A series of micro-vias 24A.1–24A.N provides both an RF ground and a heat flow path. The buried vias 18A–18N are located in close proximity to the micro-vias 24A–24N and provide a heat path through the majority of the board depth. The buried vias 18A–18N carry the heat from the second conductive layer 16A, the ground layer under the RF section, to the sixth conductive layer 22B.

The micro-vias 24B.1–24B.N transfer the heat from the sixth conductive layer 22B to an external heat sink (not shown) coupled to the sixth conductive layer 22B on the board. The micro-vias 24B.1–24B.N are located in proximity to the buried vias 18A–18N to more effectively transfer heat. The micro-vias 24B.1–24B.N may be scattered under the part outline 100. Also shown in FIG. 7 are a series of conductive pads 108 for the leads of the RF part. It is also possible to locate one of the buried vias 18A–18N directly beneath one of the micro-vias 24A.1–24A.N, with the buried vias filled. Likewise, it is possible to locate one of the buried vias 18A–18N directly above one of the micro-vias 24B.1–24B.N.

The RF characteristics of the micro-vias, such as 24A, which connect the first conductive layer 22A and the second conductive layer 16A are important, especially if they are used to carry ground currents or RF signaling. The RF performance of a micro-via is best when the micro-vias has uniform shape, meaning that the sloping walls of the micro-via are fairly smooth and uniformly sloped.

Conventional wisdom is to use prepreg material with as much resin and as little fiberglass as possible to achieve micro-vias with a uniform shape. Contrary to this teaching, with the present invention, a prepreg material that has less resin produces a via with a more uniform shape. Thus, in a board with less resin, the percentage of fiberglass in the removed material is more uniform over the surface of the board leading to the formation of more uniform vias. Thus, as noted above, the prepreg material used in the first preferred embodiment uses 7628 GETEK™ prepreg material which has a relatively low resin content. The use of a low resin content material also increases the board flatness on a microscopic level.

In order to bring an RF signal onto the board as well as transition an RF signal off the board, some means of connecting the board to an external signal carrying mechanism must be devised. One typical external signal carrying mechanism is the waveguide. A waveguide is an electromagnetic feed line used in microwave communications. A waveguide consists of a rectangular or cylindrical metal tube or pipe. The electromagnetic field of the carried signal propagates lengthwise down the waveguide. A waveguide provides low loss and high efficiency connection as long as the interior of the waveguide is kept clean and dry.

Figure 8:
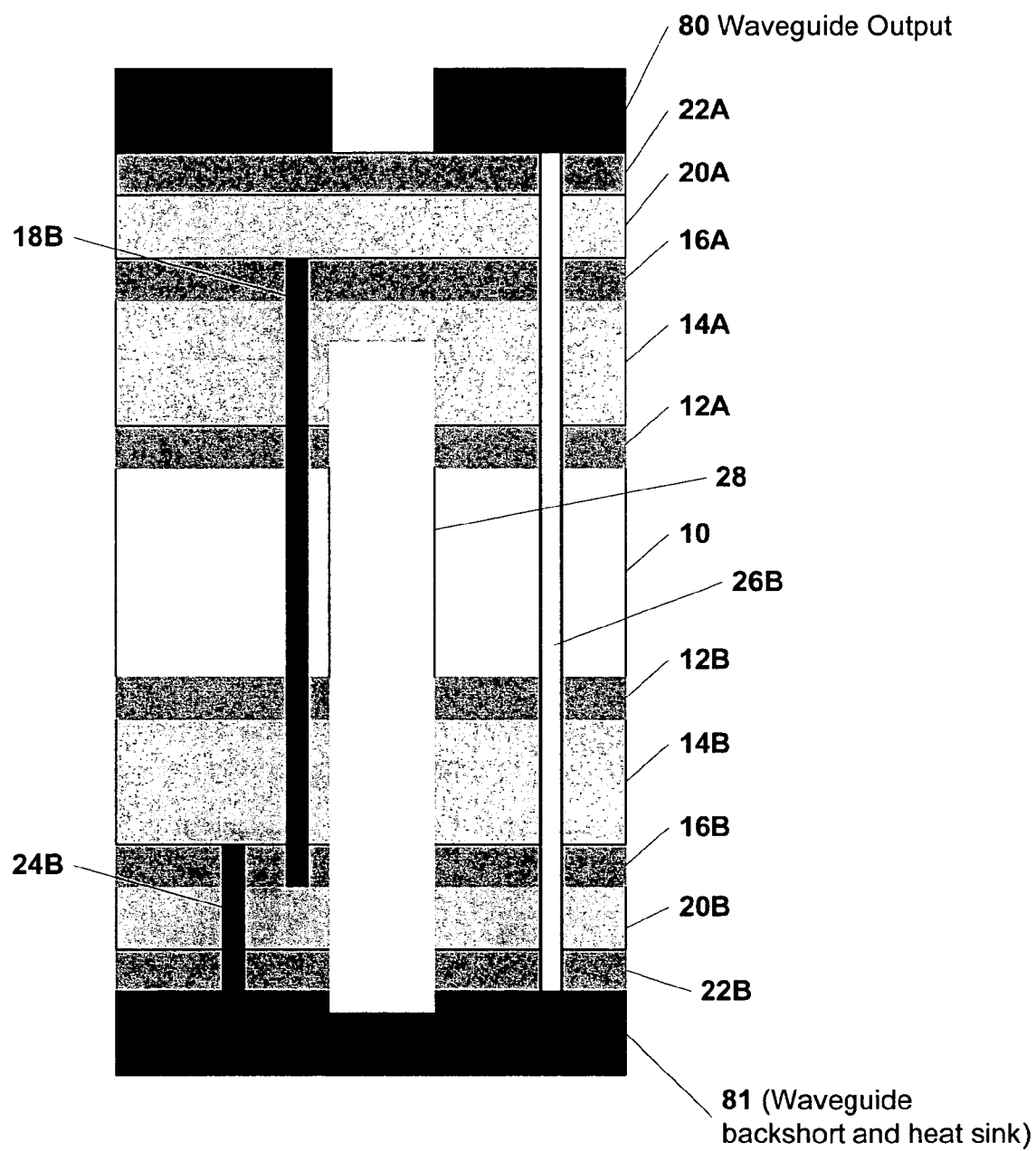
FIGS. 8 and 9 illustrate a vertical and a horizontal cross-sectional views, respectively, of the routed opening in the stack up structure in accordance with the present invention.
Figure 9:
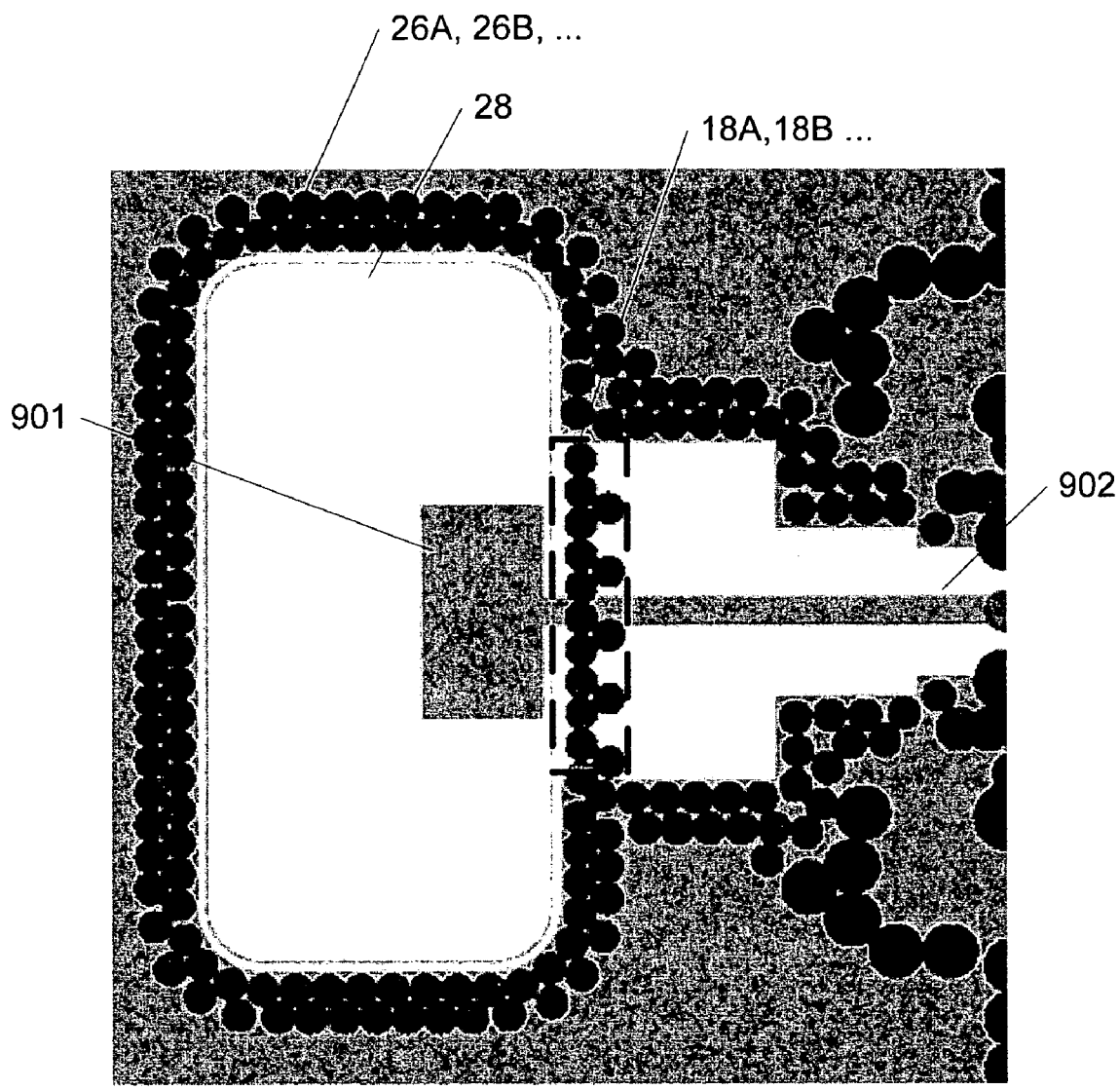

In the first preferred embodiment, to facilitate the signal transition via a waveguide, the stack up 300 is routed from the second outer-most conductive layer 22B through to part-way into the first inner prepreg layer 14A. FIGS. 8 and 9 illustrate a vertical and a horizontal cross-sectional views, respectively, of the routed opening 28 in the stack up structure in accordance with the present invention. Buried vias (18A, 18B, . . . ) are drilled as described above such that they form the walls of the routed opening 28. In FIG. 9, these buried vias (18A, 18B, . . . ) reside within the area marked with a dotted rectangle starting in Layer 2 of the stack up 300. By drilling the buried vias (18A, 18B, . . . ) in this way, a virtual waveguide is created within the route opening 28. A metal patch 901 is mounted on top of the conductive layer 22A over the opening 28. A microstrip 902 traverses on top of the buried vias (18A, 18B, . . . ) to the metal patch 901. In this manner, signals received by the board are sent from the microstrip through the metal patch 901 to the waveguide 28. Similarly, signals transmitted by the board are sent from the waveguide 28 to the metal patch 901 and to the microstrip 902. Transitioning signals on and off the board in this manner requires no tuning on the board. The routed opening 28 is also a transition which is less lossy than conventional boards.

Figure 10:
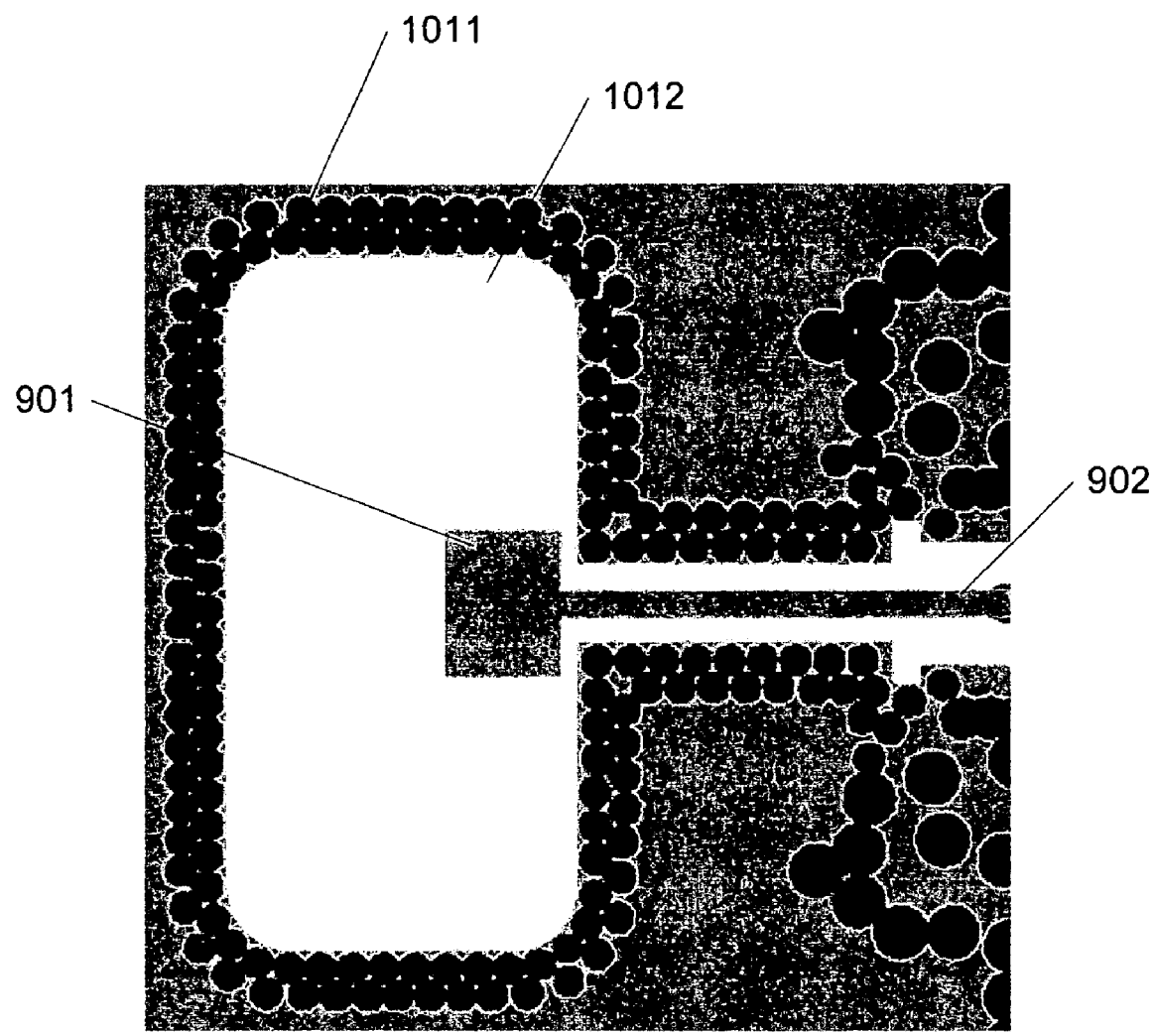
FIG. 10 illustrates a horizontal cross-sectional view of a second preferred embodiment of a stack up for a multi-layered integrated RF/IF circuit board in accordance with the present invention.

Although the first preferred embodiment describes the stack up with buried vias as the walls of the waveguide, a stack up can be designed such that the buried vias are not necessary. FIG. 10 illustrates a horizontal cross-sectional view of a second preferred embodiment of a stack up for a multi-layered integrated RF/IF circuit board in accordance with the present invention. In the second embodiment, the through vias 1011 are drilled very close to the microstrip 902. With this configuration of through vias 1011, signals can be carried between the routed opening 1012 and the microstrip 902 via the metal patch 901 without the need for buried vias.

Figure 11:
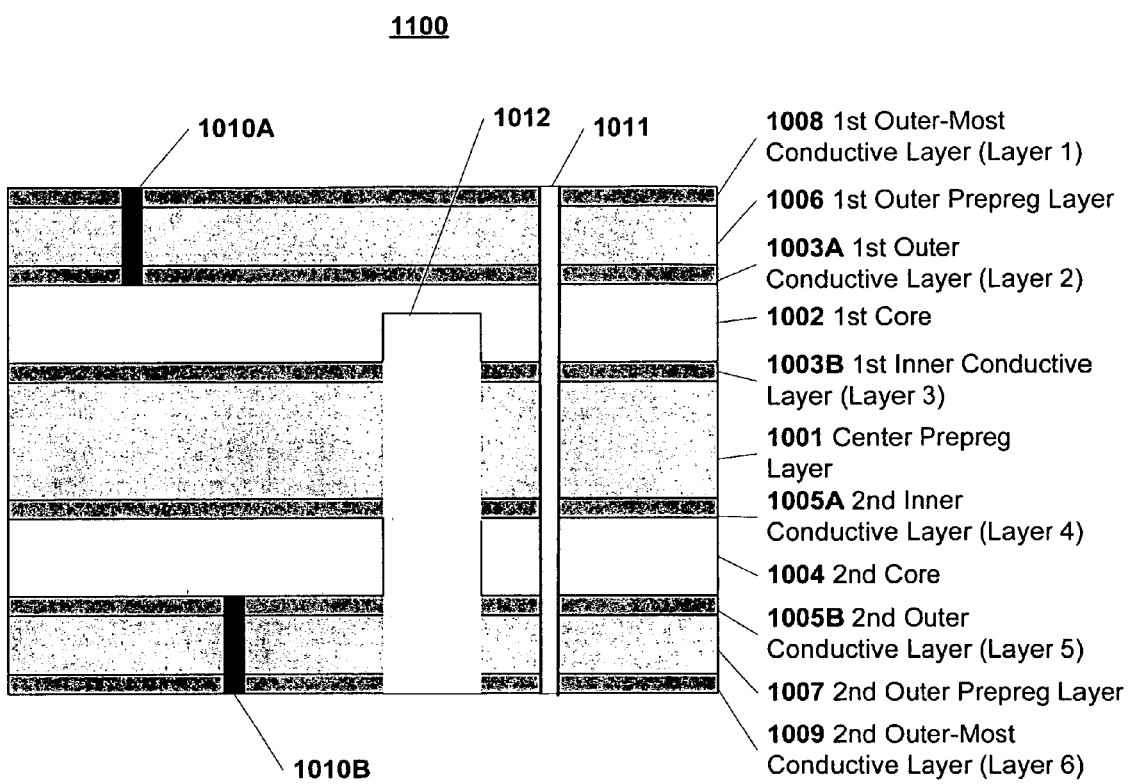
FIG. 11 illustrates a vertical cross-sectional view of a second preferred embodiment of a stack up structure for a multi-layered integrated RF/IF circuit board in accordance with the present invention.

Without the need for buried vias, a second preferred embodiment of the stack up structure which is even less expensive to manufacture than the first preferred embodiment of the stack up structure 300 is possible. FIG. 11 illustrates a vertical cross-sectional view of a second preferred embodiment of a stack up structure for a multi-layered integrated RF/IF circuit board in accordance with the present invention. The second preferred embodiment of the stack up 1100 comprises a pliable non-conductive center material 1001 with a plurality of conductive and non-conductive layers at its upper and lower surfaces. In this embodiment, the non-conductive layers are prepreg layers. The final stack up 1100 comprises a first, outer most conductive layer 1008, forming layer 1 of the stack up 1100. Components for signal output are mounted on top of the conductive layer 1008. Coupled to the upper surface of the central prepreg layer 1001, the final stack up 1100 also comprises a first outer prepreg layer 1006, a first outer conductive layer 1003A, a first core 1002, and a first inner conductive layer 1003B. Coupled to the lower surface of the center prepreg layer 1001, the stack up 1100 also comprises a second inner conductive layer 1005A, a second core 1004, a second outer conductive layer 1005B, a second outer prepreg layer 1007, and a second outer-most conductive layer 1009. A waveguide backshort and heat sink (not shown) can be mounted beneath the sixth conductive layer 1009. Traces are etched onto the conductive layers 1003A, 1003B, 1005A, and 1005B.

The stack up 1100 further comprises a plurality of vias, including micro-vias 1010A–1010B and through vias 1011. The stack up 1100 further comprises a routed opening 1012 for the waveguide which traverses from the bottom of the stack up 1100 to approximately half-way into the first core 1002.

Note that the stack up 1100 has no buried vias, as they are not necessary to provide walls to the routed opening 1012. The stack up 1100 is also symmetrical about a center layer 1001. Electrically, the second preferred embodiment of the stack up 1100 is substantially identical to the first preferred embodiment of the stack up 300. In the stack up 1100, the first outer conductive layer 1003A provides the RF ground, while the first inner conductive layer 1003B provide the IF ground. The second outer-most conductive layer 1009 is the ground or routing layer for the stack up 1100. However, because the stack up 1100 does not have buried vias, its manufacturing process is less expensive than for the stack up 300.

Figure 12:
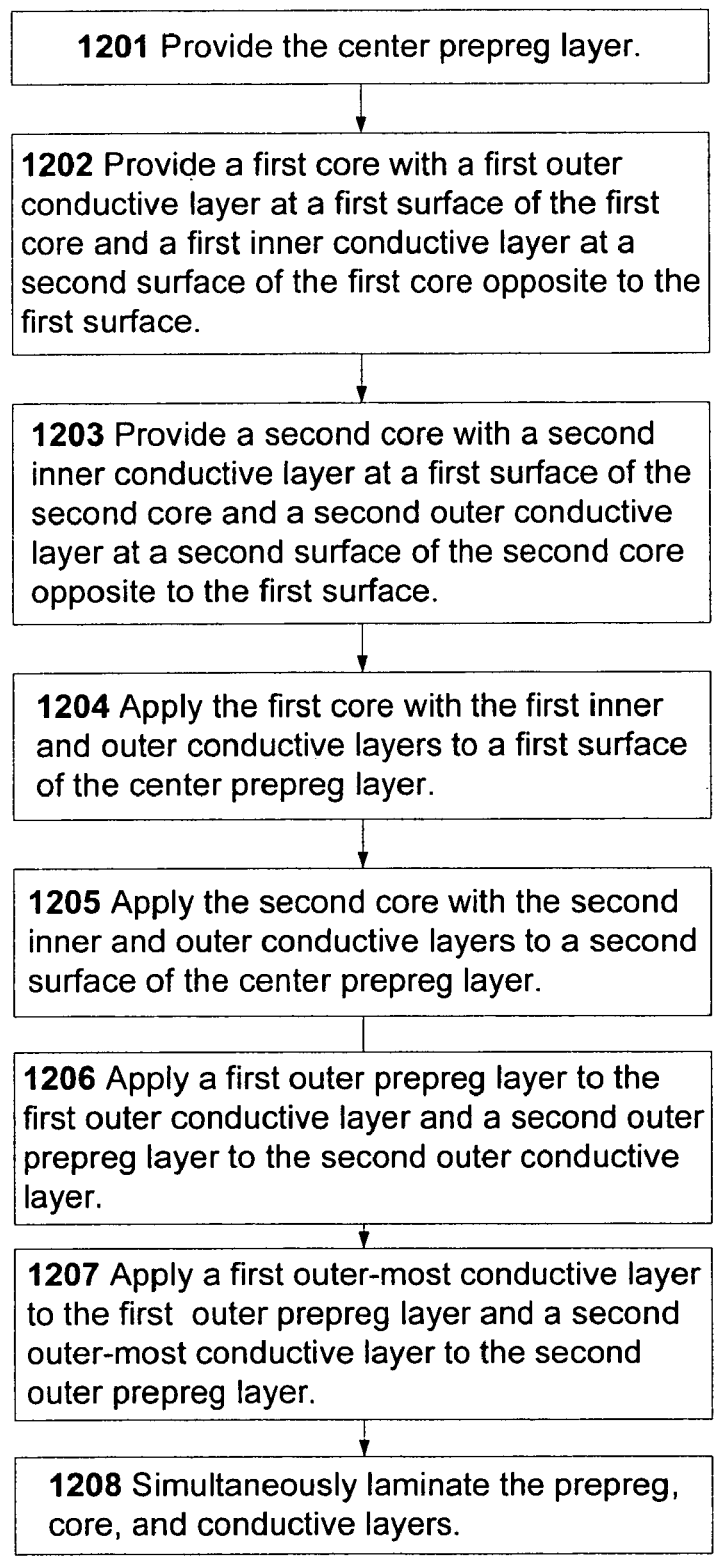
FIG. 12 is a flowchart illustrating a second preferred embodiment of a method for fabricating a multi-layered integrated RF/IF circuit board in accordance with the present invention.

FIG. 12 is a flowchart illustrating a second preferred embodiment of a method for fabricating a multi-layered integrated RF/IF circuit board in accordance with the present invention. The process begins with the center prepreg layer 1001, via step 1201. Then, a first core 1002 is provided with a first outer conductive layer 1003A at a first surface of the first core 1002 and a first inner conductive layer 1003B at a second surface of the first core 1002 opposite to the first surface, via step 1202. A second core 1004 with a second inner conductive layer 1005A at a first surface of the second core 1004 and a second outer conductive layer 1005B at a second surface of the second core 1004 opposite to the first surface is also provided, via step 1203. Then, the first inner conductive layer 1003B, with the core 1002 and the first outer conductive layer 1003A, is applied to a first surface of the center prepreg layer 1001, via step 1204. The second inner conductive layer 1005A, with the second core 1004 and the second outer conductive layer 1005B, is applied to a second surface of the center prepreg layer 1001, via step 1205. Next, the first outer prepreg layer 1008 is applied to the first outer conductive layer 1003A, and the second outer prepreg layer 1007 is applied to the second outer conductive layer 1005B, via step 1206. Next, the first outer-most conductive layer 1008 is applied to the first outer prepreg layer 1006, and a second outer-most conductive layer 1009 is applied to the second outer prepreg layer 1007, via step 1207. The prepreg, core, and conductive layers are then laminated, via step 1208. Thus, with the second preferred embodiment, the stack up 1100 is fabricated with a single lamination step. Because both the upper and lower surfaces are primarily soft prepreg, any stresses introduced during the lamination process can be absorbed by the flow of the melted resin. At the completion of step 1208, when the cooled board is removed from the press, the board remains flat.

Figure 13:
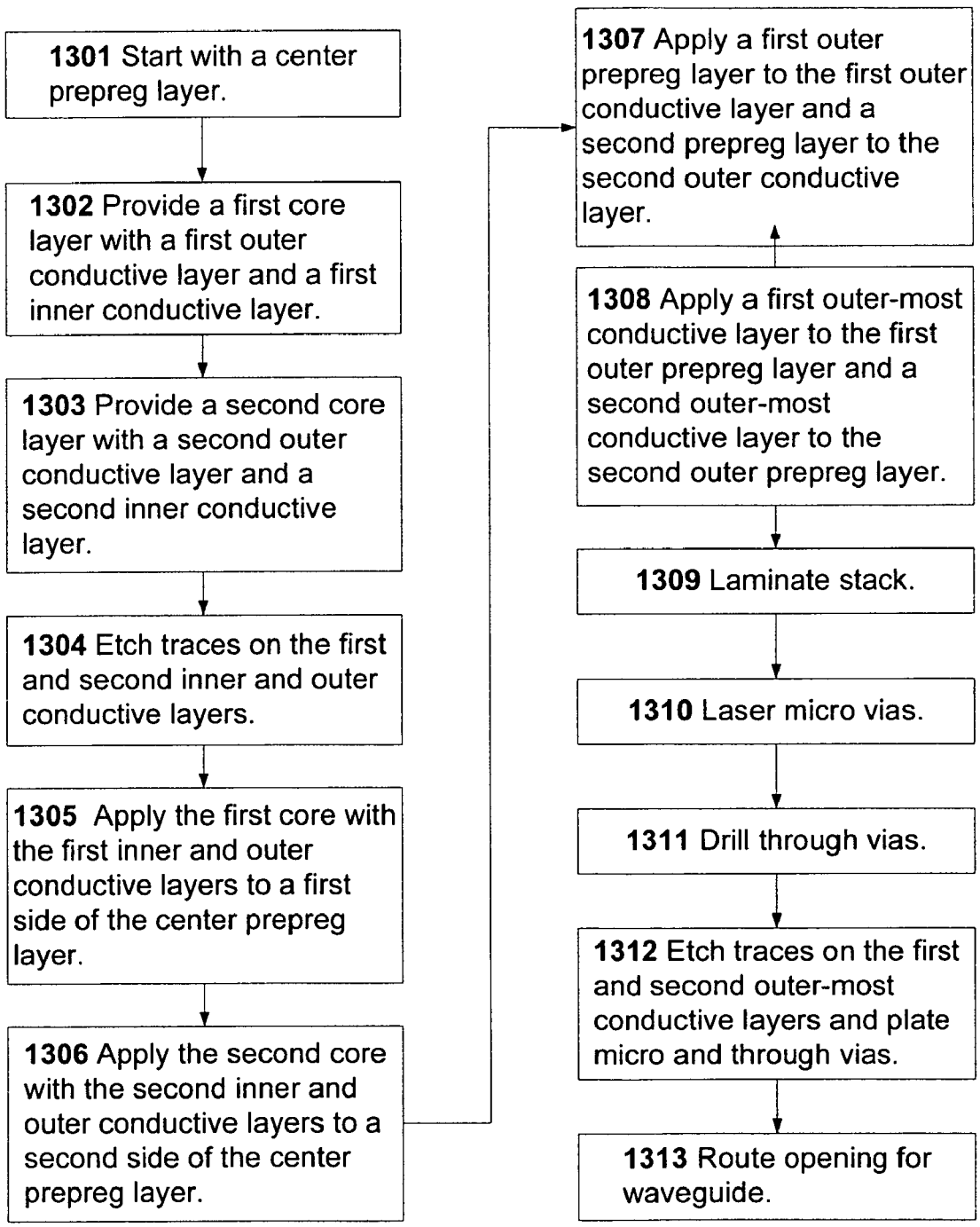
FIG. 13 is a flowchart illustrating in more detail the second preferred embodiment of a method for fabricating a multi-layered integrated RF/IF circuit board in accordance with the present invention.

FIG. 13 is a flowchart illustrating in more detail the second preferred embodiment of a method for fabricating a multi-layered integrated RF/IF circuit board in accordance with the present invention. FIGS. 14A through 14E illustrate the steps of this method. Referring to FIG. 13 and FIGS. 14A through 14E, the process begins with the center prepreg layer 1001, via step 1301 and illustrated in FIG. 14A. Then, a first core 1002 with the first outer conductive layer 1003A and the first inner conductive layer 1003B are provided, via step 1302 and illustrated in FIG. 14B. The second core 1004 with the second inner conductive layer 1005A and a second outer conductive layer 1005B are also provided, via step 1303. Traces are then etched on the first and second inner and outer conductive layers 1003A, 1003B, 10054A, 1005B, via step 1304.

Figure 14A:
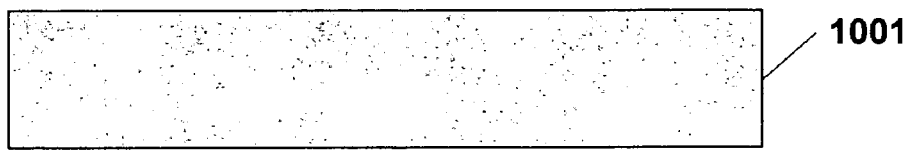
FIGS. 14A through 14E illustrate the steps of the second preferred embodiment of the method for fabricating the multi-layered integrated RF/IF circuit board in accordance with the present invention.
Figure 14B:
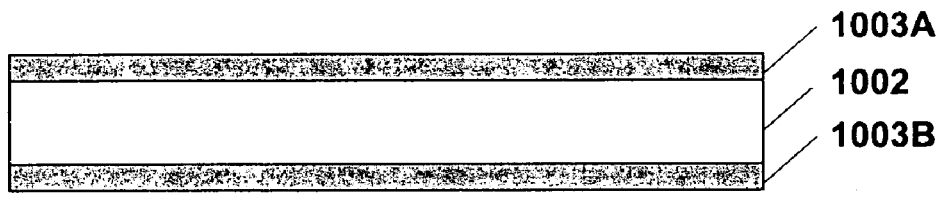
Figure 14B:
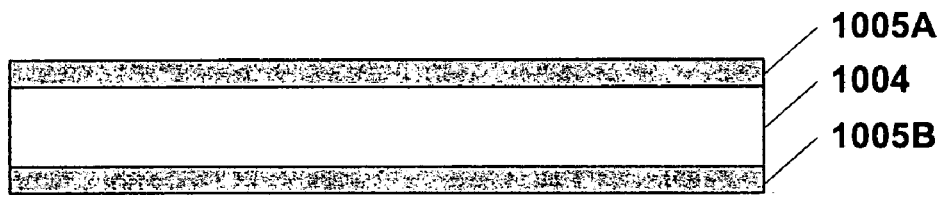
Figure 14C:
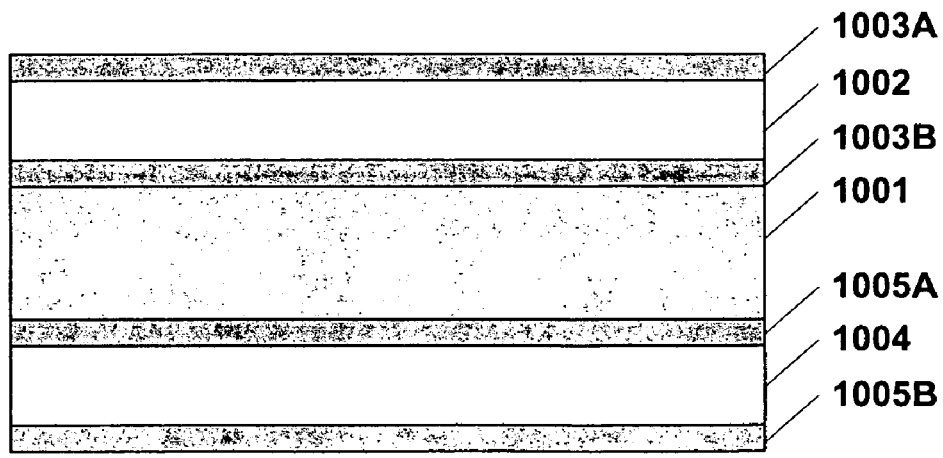
Figure 14D:
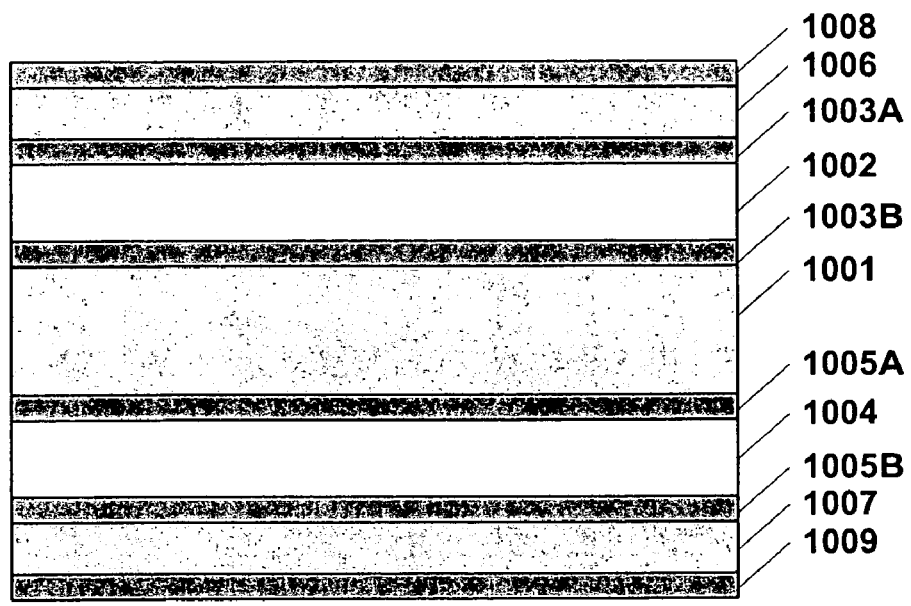
Figure 14E:
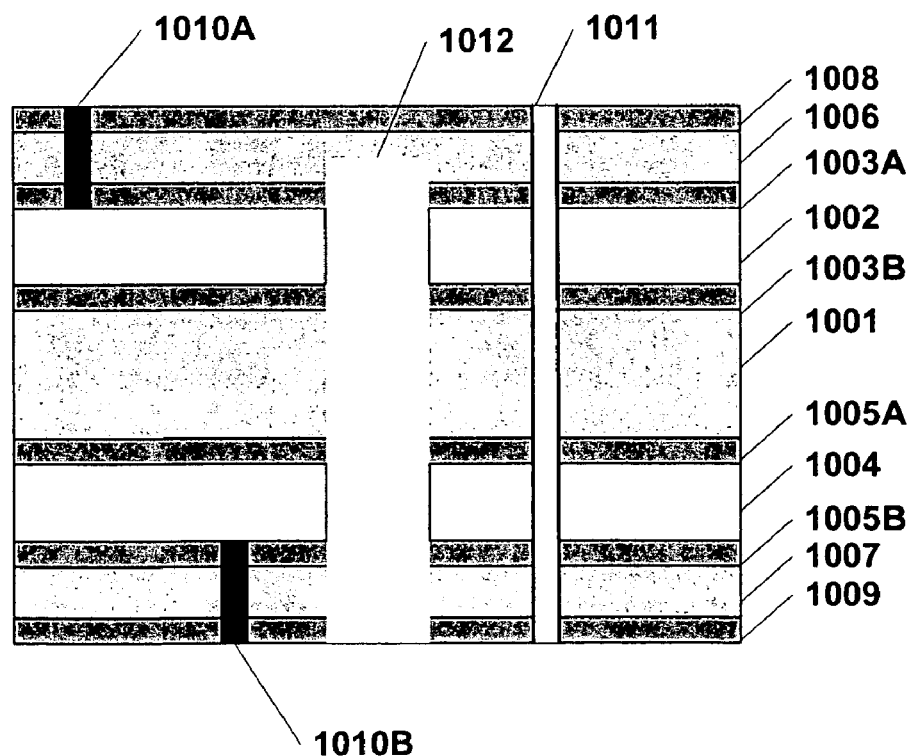

The first core 1002 with the first inner and outer conductive layers 1003A–1003B are then applied to the first side of the center prepreg layer 1001, via step 1305 and illustrated in FIG. 14C. The second core 1004 with the second inner and outer conductive layers 1005A–1005B are also applied to the second side of the center prepreg layer 1001, via step 1306. Next, the first outer prepreg layer 1008 is applied to the first outer conductive layer 1003A, and a second outer prepreg layer 1007 is applied to the second outer conductive layer 1005B, via step 1307 and illustrated in FIG. 14D. Then the first outer-most conductive layer 1008 is applied to the first outer prepreg layer 1006, and a second outer-most conductive layer 1009 is applied to the second outer prepreg layer 1007, via step 1308 and illustrated in FIG. 14D.

The conductive layers, prepreg layers, and cores, are then laminated together, via step 1309. The micro-vias 1010A–1010B are then lasered into the stack up 1100, via step 1310, the through vias 1011 are drilled, via step 1311 and illustrated in FIG. 14E. Traces are etched on the first and second outer-most conductive layers 1008-1009 with the micro-vias 1010A–1010B and the through vias 1011, via step 1312. An opening 1012 is then routed for the waveguide, via step 1313 and illustrated in FIG. 14E.

As with the first preferred embodiment of the stack up 300, the first outer conductive layer 1003A is etched under the IF section of the board. Thus, the first outer non-conductive layer and the first core touch to form a single dielectric layer. In this manner, a thicker dielectric under the IF section of the board is provided, which provides good performance at IF.

In the second preferred embodiment of the stack up 1100, the heat flow paths are provided by the through vias 1011. The through vias 1011 are interleaved with pads for solder balls (not shown) of the components mounted on the first outer-most conductive layer 1008.

Once the stack up 300 or 1100 is formed, components (not shown) are coupled to the outer surface of the first outer-most conductive layer 22A or 1008, respectively. One of these components is a filter. In the preferred embodiments, the filter is an alumina filter. In placing the filter upon the conductive layer 22A or 1008, accurate alignment to the input and output signal transitions of the board is important. This is because a housing is later clamped to the board around the filter with tight tolerances since the housing creates a very specific electrical cavity. If the filter is not aligned accurately, the housing would hit the filter and destroy it during assembly. To facilitate the accurate placement of the filter, the present invention utilizes a specific solder pad and resist pattern.

Figure 15:
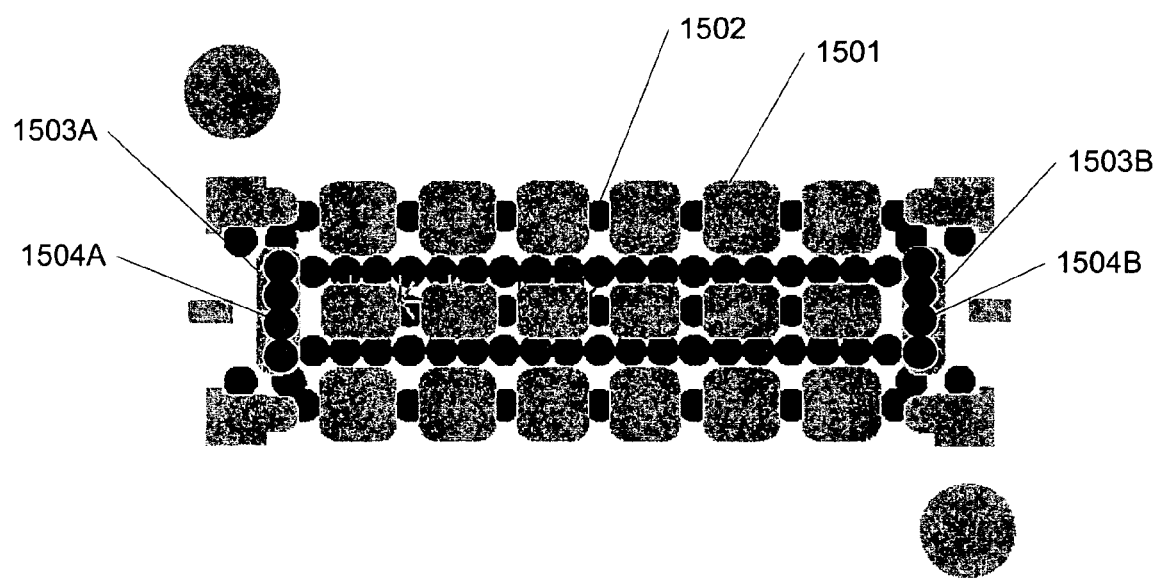
FIG. 15 illustrates a preferred embodiment of the solder pad and solder resist pattern for mounting a filter onto a circuit board in accordance with the present invention.

FIG. 15 illustrates a preferred embodiment of the solder pad and solder resist pattern for mounting a filter onto a circuit board in accordance with the present invention. Here, the filter must align to the signal input/output transitions 1503A–1503B. Micro-vias 1504A–1504B are placed under these transitions to bring the ground up into the filter. The solder resist 1501 and solder pads 1502 are strategically placed on the board, such that when the filter is aligned and attached onto the board, the filter does not misalign to the transitions 1503A–1503B and also remains flat. In this manner, a filter can be mounted onto the board without being destroyed by the housing during assembly.

An improved multi-layered integrated RF/IF circuit board has been disclosed. The board is fabricated beginning with a center layer of material. In a first preferred embodiment, the center layer is a rigid core material. In a second preferred embodiment, the center layer is a pliable non-conductive material. For every layer added to the upper surface of the stack-up structure of the board, a corresponding layer of the same material is added to the lower surface of the stack-up structure. Thus, during the lamination process, both the upper and lower surfaces are primarily soft, pliable non-conductive material. These non-conductive layers absorb any stresses introduced during the lamination process. Thus, when cooled, the board has large area flatness. Standard manufacturing processes can be used for each individual step in the fabrication of the board. Therefore, a multi-layered integrated RF/IF circuit board in accordance with the present invention can be fabricated inexpensively.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A multi-layered integrated RF/IF circuit board including a high radio frequency (RF) portion and a lower intermediate frequency (IF) portion, the board comprising:
   a core with a first inner conductive layer on a first surface of the core and a second inner conductive layer on a second surface of the core opposite to the first surface;
   a first inner non-conductive layer on the first inner conductive layer and a second inner non-conductive layer on the second inner conductive layer;
   a first outer conductive layer on the first inner non-conductive layer and a second outer conductive layer on the second inner non-conductive layer;
   a first outer non-conductive layer on the first outer conductive layer and a second outer non-conductive layer on the second outer conductive layer, the first outer non-conductive layer being of a same material as the first inner non-conductive layer; and
   a first outer-most conductive layer on the first outer non-conductive layer and a second outer-most conductive layer on the second outer non-conductive layer,
   wherein the first outer conductive layer underneath the lower intermediate frequency (IF) portion of the board is etched away such that the first outer non-conductive layer and the first inner non-conductive layer touch one another and form a single substrate underneath the lower intermediate frequency (IF) portion of the board due to the first outer non-conductive layer and the first inner non-conductive layer being of the same material.

2. The board of claim 1, wherein the first inner conductive layer and the second inner conductive layer comprise traces.

3. The board of claim 1, wherein the first outer conductive layer and the second outer conductive layer comprise traces.

4. The board of claim 1, further comprising a plurality of buried vias, each of the plurality of buried vias traversing through the first outer conductive layer, the second outer conductive layer, the first inner non-conductive layer, the second inner non-conductive layer, the first inner conductive layer, the second inner conductive layer, and the core.

5. The board of claim 4, further comprising:
   a first plurality of micro-vias, each of the first plurality of micro-vias traversing the first outer-most conductive layer, the first outer non-conductive layer, and the first outer conductive layer;
   a second plurality of micro-vias, each of the second plurality of micro-vias traversing the second outer-most conductive layer, the second outer non-conductive layer, and the second outer conductive layer; and
   a plurality of through vias, each of the plurality of through vias traversing the first outer-most conductive layer, the second outer-most conductive layer, the first outer non-conductive layer, the second outer non-conductive layer, the first outer conductive layer, the second outer conductive layer, the first inner non-conductive layer, the second inner non-conductive layer, the first inner conductive layer, the second inner conductive layer, and the core.

6. The board of claim 5, wherein:
the first plurality of micro-vias provide a heat flow path between the first outer-most conductive layer and the first outer conductive layer;
the plurality of buried vias is in close proximity to the first plurality of micro-vias and the second plurality of micro-vias, the plurality of buried vias providing a heat flow path between the first outer conductive layer and the second outer conductive layer; and
the second plurality of micro-vias provide a heat flow path between the second outer conductive layer and an external heat sink coupled to the second outer-most conductive layer.

7. The board of claim 5, wherein each of the core, the first inner non-conductive layer, the second inner non-conductive layer, the first outer non-conductive layer, and the second outer non-conductive layer comprise prepreg material having a greater percentage of fiberglass relative to resin, the greater percentage of fiberglass in the prepreg material permitting each of the buried vias, the first plurality of micro-vias, the second plurality of micro-vias, and the plurality of through vias to have a substantially uniform shape.

8. The board of claim 7, wherein the prepreg material comprises 7628GETEK prepreg material.

9. The board of claim 4, further comprising:
an opening for a waveguide, the opening traversing the second outer-most conductive layer, the second outer non-conductive layer, the first outer conductive layer, the second outer conductive layer, the first inner non-conductive layer, the second inner non-conductive layer, the first inner conductive layer, the second inner conductive layer, and the core,
wherein the plurality of buried vias comprise walls of the opening.

10. The board of claim 9, further comprising:
a microstrip line proximate to the opening;
a metal patch proximate to the microstrip line; and
a microstrip mounted on the first outer-most conductive layer proximate to the metal patch,
wherein signals are carried through the opening, the microstrip line, the metal patch, and the microstrip.

11. The board of claim 1, wherein the first outer-most conductive layer and the second outer-most conductive layer comprise traces.

* * * * *